(12) United States Patent
Qi et al.

(10) Patent No.: US 11,127,840 B2
(45) Date of Patent: Sep. 21, 2021

(54) METHOD FOR MANUFACTURING ISOLATION STRUCTURE FOR LDMOS

(71) Applicant: CSMC TECHNOLOGIES FAB2 CO., LTD., Jiangsu (CN)

(72) Inventors: Shukun Qi, Jiangsu (CN); Guipeng Sun, Jiangsu (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 216 days.

(21) Appl. No.: 16/481,576

(22) PCT Filed: Jul. 3, 2018

(86) PCT No.: PCT/CN2018/094354
§ 371 (c)(1),
(2) Date: Jul. 29, 2019

(87) PCT Pub. No.: WO2019/007343
PCT Pub. Date: Jan. 10, 2019

(65) Prior Publication Data
US 2020/0006529 A1    Jan. 2, 2020

(30) Foreign Application Priority Data
Jul. 3, 2017    (CN) .......................... 201710534702.1

(51) Int. Cl.
*H01L 21/763* (2006.01)
*H01L 21/473* (2006.01)
(Continued)

(52) U.S. Cl.
CPC .... *H01L 29/66704* (2013.01); *H01L 21/0217* (2013.01); *H01L 21/02164* (2013.01);
(Continued)

(58) Field of Classification Search
None
See application file for complete search history.

(56) References Cited

U.S. PATENT DOCUMENTS

| 5,940,719 A | 8/1999 | Jang et al. |
| 6,040,231 A | 3/2000 | Wu |

(Continued)

FOREIGN PATENT DOCUMENTS

| CN | 1359146 A | 7/2002 |
| CN | 1913120 A | 2/2007 |

(Continued)

OTHER PUBLICATIONS

International Search Report dated Sep. 26, 2018 in PCT/CN2018/094354. 2 pages.

(Continued)

*Primary Examiner* — Joseph C. Nicely
*Assistant Examiner* — Lamont B Koo
(74) *Attorney, Agent, or Firm* — Polsinelli PC

(57) ABSTRACT

Disclosed is a method for manufacturing an isolation structure for LDMOS, the method comprising: forming a first groove on the surface of a wafer; filling the first groove with silicon oxide; removing part of the surface of the silicon oxide within the first groove by means of etching; forming a silicon oxide corner structure at the corner of the top of the first groove by means of thermal oxidation; depositing a nitrogen-containing compound on the surface of the wafer to cover the surface of the silicon oxide within the first groove and the surface of the silicon oxide corner structure; dry-etching the nitrogen-containing compound to remove the nitrogen-containing compound from the surface of the silicon oxide within the first groove, and thereby forming a nitrogen-containing compound side wall residue; with the nitrogen-containing compound side wall residue as a mask, (Continued)

continuing to etch downwards to form a second groove; forming a silicon oxide layer on the side wall and the bottom of the second groove; removing the nitrogen-containing compound side wall residue; and filling the first groove and the second groove with silicon oxide.

20 Claims, 5 Drawing Sheets

(51) Int. Cl.
H01L 29/66 (2006.01)
H01L 21/02 (2006.01)
H01L 21/311 (2006.01)
H01L 21/762 (2006.01)

(52) U.S. Cl.
CPC .. *H01L 21/31116* (2013.01); *H01L 21/31144* (2013.01); *H01L 21/76235* (2013.01)

(56) References Cited

U.S. PATENT DOCUMENTS

| 6,812,120 B1 | 11/2004 | Young et al. |
| 2006/0264003 A1 | 11/2006 | Eun |
| 2007/0178660 A1* | 8/2007 | Miller ................ H01L 21/763 438/424 |
| 2013/0193548 A1 | 8/2013 | Kim |

FOREIGN PATENT DOCUMENTS

| CN | 101673702 A | 3/2010 |
| CN | 102087989 A | 6/2011 |
| CN | 103258842 A | 8/2013 |
| CN | 103811323 A | 5/2014 |
| CN | 104517886 A | 4/2015 |
| JP | 10-4136 A | 1/1998 |
| JP | 2002-76287 A | 3/2002 |

OTHER PUBLICATIONS

Office Action dated Mar. 23, 2020 issued in corresponding Chinese Patent Application No. 201710534702.1 (6 pages).

* cited by examiner

US 11,127,840 B2

METHOD FOR MANUFACTURING ISOLATION STRUCTURE FOR LDMOS

CROSS REFERENCE TO RELATED APPLICATIONS

This application is a National Stage for International Application PCT/CN2018/094354, filed on Jul. 3, 2018, which claims priority of Chinese Patent Application No. 201710534702.1, filed with the CNIPA on Jul. 3, 2017, and entitled "METHOD FOR MANUFACTURING ISOLATION STRUCTURE FOR LDMOS", and the entire content of the both applications is incorporated herein in its entirety.

TECHNICAL FIELD

The present disclosure relates to semiconductor manufacturing field, and in particular to method of manufacturing lateral double diffusion metal oxide semiconductor (LDMOS) trench isolation structure.

BACKGROUND

By introducing a shallow-trench-isolation (STI) process into a drift region of an LDMOS device, the length of the drift region can be extended longitudinally toward the substrate, meanwhile, the device length can be reduced and hence the area can be reduced. Also the STI reduces the electric field of the gate/drain of the device, reduces the parasitic capacitance, the optimization window of the device voltage BVdss and on-resistance Ron_sp is significantly improved.

SUMMARY

According to embodiments of the disclosure, a method of manufacturing a trench isolation structure of an LDMOS is provided.

A method of manufacturing a trench isolation structure of an LDMOS includes: forming a first trench having a wide top and a narrow bottom on a surface of the wafer; filling silicon oxide into the first trench by depositing; removing a portion of a surface of the silicon oxide in the first trench by etching; forming a silicon oxide corner structure at a corner of the top of the first trench by thermal oxidation, the silicon oxide corner structure being a structure in which the silicon oxide in the first trench gradually becomes thicker from the corner downward; depositing a nitrogen-containing compound on the surface of the wafer to cover the surface of the silicon oxide in the first trench and a surface of the silicon oxide corner structure; dry-etching the nitrogen-containing compound, removing the nitrogen-containing compound on the surface of the silicon oxide in the first trench, and forming a nitrogen-containing compound sidewall residue extending into the trench on the surface of the silicon oxide corner structure; continuing etching the silicon oxide and the wafer downwardly using the nitrogen-containing compound sidewall residue as a mask and forming a second trench; forming a silicon oxide layer on a sidewall and a bottom of the second trench; removing the nitrogen-containing compound sidewall residue; and filling the first trench and the second trench with the silicon oxide.

Details of one or more embodiments of the disclosure will be introduced in the drawings and descriptions as follows. And other characteristics, purposes and advantages of the present disclosure will be apparent from the specification, drawings and appended claims.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION OF THE EMBODIMENTS

Embodiments of the disclosure are described more fully hereinafter with reference to the accompanying drawings. The various embodiments of the disclosure may, however, be embodied in many different forms and should not be construed as limited to the embodiments set forth herein. Rather, these embodiments are provided so that this disclosure will be thorough and complete, and will fully convey the scope of the disclosure to those skilled in the art.

Unless otherwise defined, all terms (including technical and scientific terms) used herein have the same meaning as commonly understood by one of ordinary skill in the art to which this disclosure belongs. It will be further understood that terms used in the specification of the disclosure should be interpreted for the purpose of describing particular embodiments as opposed to limiting the disclosure, the term "and/or" includes any and all combinations of one or more listed items.

The semiconductor terminology used herein is a technical vocabulary commonly used by those skilled in the art, for example, for P type and N type impurities, in order to distinguish doping concentrations, P+ type represents P type of heavy doping concentration, P type represents P type of moderate doping concentration, the P− type represents the P type of light doping concentration, the N+ type represents the N type of heavy doping concentration, the N type represents the N type of the moderate doping concentration, and the N− type represents the N type of the light doping concentration.

In the conventional shallow trench isolation structure, both sidewalls of are parallel and vertically distributed, and the electric field is concentrated at the bottom of the shallow trench isolation structure close to the corner of the source region, so that the electric field distribution between the source region and the drain region is not uniform, which may cause a new dense electric field to be generated at the bottom middle position of the shallow trench isolation structure and at a corner away from the source region, where lateral voltage breakdown may easily happen.

Figure 1:
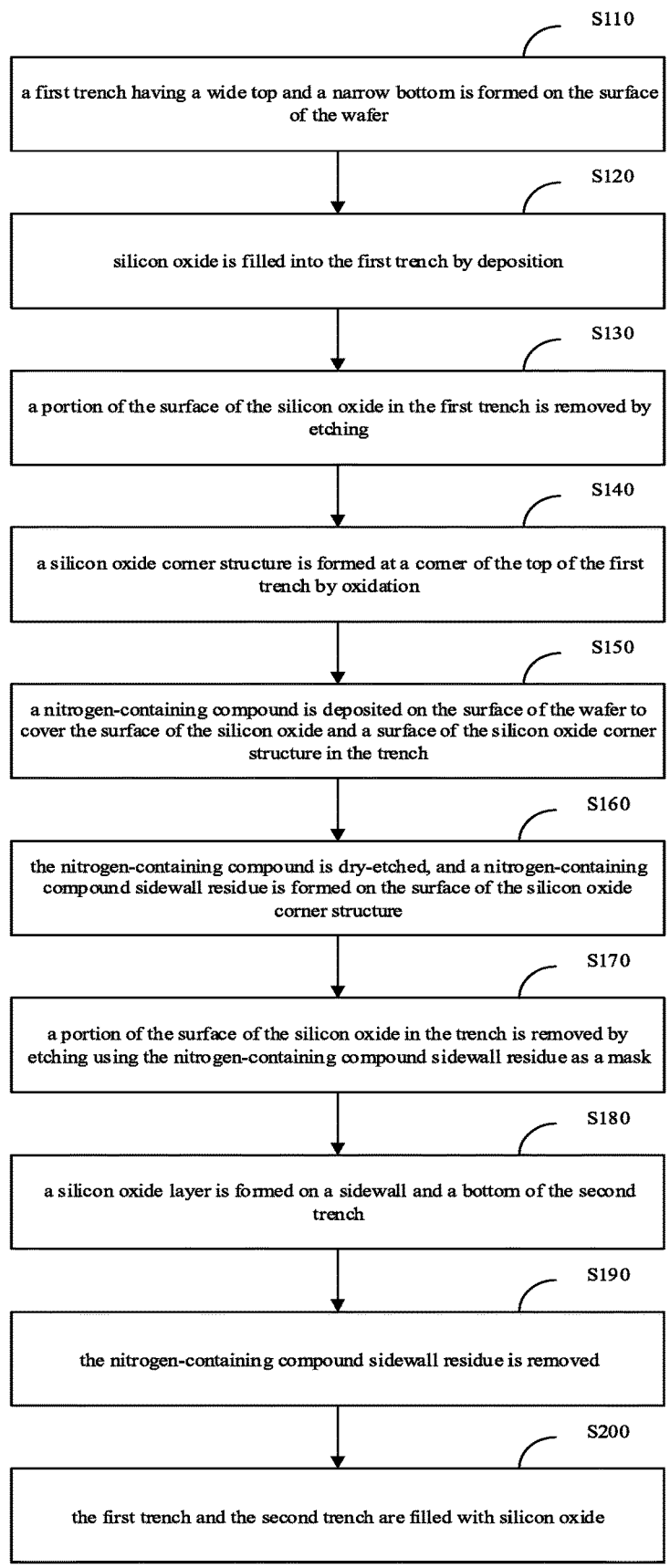
FIG. 1 is a flowchart of a method of manufacturing an isolation structure of an LDMOS according to an embodiment.

FIG. 1 is a flowchart of a method for manufacturing an isolation structure of an LDMOS according to an embodiment, which includes the following steps:

In step S110, a first trench having a wide top and a narrow bottom is formed on the surface of the wafer.

The first trench (shallow trench) having the wide top and the narrow bottom may be etched on the surface of the wafer (silicon wafer in this embodiment) using processes known in the art. In the embodiment, a silicon nitride film can be formed on the surface of the wafer before the first trench is formed by etching, an etch window is formed on the silicon nitride film by patterning a photoresist, and then the first trench is formed by etching through the silicon nitride film via the etch window, a silicon nitride layer is formed around the top of the first trench after the etching is completed. In this embodiment, the etching of silicon nitride film is dry-etching using $CHCl_3$ and/or $CH_2Cl_2$ as etchants, and other trench etching processes known in the art may be used in other embodiments. After etching through the silicon nitride film, a fluorine-containing gas, such as $SF_6$, is added to the etching gas to etch the silicon wafer to form the first trench. In this embodiment, an inclination angle of a slope of the formed first trench is 60 to 70 degrees.

The upper portion of the first trench has a relatively greater width, so that the resulting trench isolation structure can reduce the potential of leakage due to high voltage routing over the trench isolation structure comparing to a narrow trench. In an embodiment, the first trench has a depth of 1 μm to 2 μm.

In an embodiment, an epitaxial layer of low doping concentration is epitaxially grown on the substrate of high doping concentration by an epitaxial process, and the trench obtained by the etching of step S110 is formed in the epitaxial layer.

In step S120, silicon oxide is filled into the first trench by deposition.

The rate at which a silicon oxide ($SiO_x$) layer is formed by a deposition process is much greater than the rate at which a silicon oxide layer is grown by conventional thermal oxidation. In this embodiment, the step S120 uses a high density plasma chemical vapor deposition (HDPCVD) process for the deposition of silicon oxide, thus a better morphology can be obtained. In other embodiments, other deposition processes known in the art may be used to deposit the silicon oxide layer according to actual requirements.

After the deposition, the excess silicon oxide layer can be removed by chemical mechanical polishing (CMP), i.e., the silicon oxide layer exposed outside the trench is removed. For an embodiment in which the first trench is etched using silicon nitride as a hard mask in step S110, the CMP is performed by polishing a silicon oxide layer to the silicon nitride layer.

In an embodiment, prior to step S120, the method further includes a step of performing sidewall oxidation on the first trench to form a sidewall oxide layer 204. The sidewall oxidation may serve to repair defects (e.g., defects due to impact of high-energy particles of reactive ion etching) generated at the silicon surface of the inner wall and bottom of the first trench during etching of the trench in step S110, and the negative effect of this defect on the gate oxygen generation is eliminated.

In step S130, a portion of the surface of the silicon oxide in the first trench is removed by etching.

Figure 2:
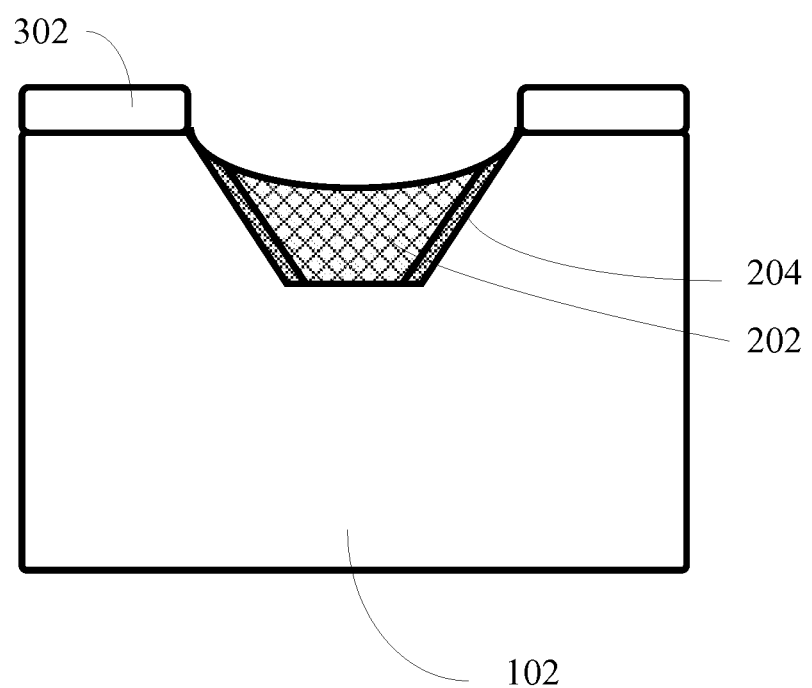
FIGS. 2 to 6 are cross-sectional views of a device manufactured by a method of manufacturing an isolation structure of an LDMOS according to an embodiment during a manufacturing process.

Dry-etching may be used to obtain a suitable morphology using its anisotropy. FIG. 2 is a cross-sectional view of the device after step S130 is completed in this embodiment. In an embodiment, the high density plasma etching process is used in the step S130.

In step S140, a silicon oxide corner structure is formed at a corner of the top of the first trench by oxidation.

Figure 3:
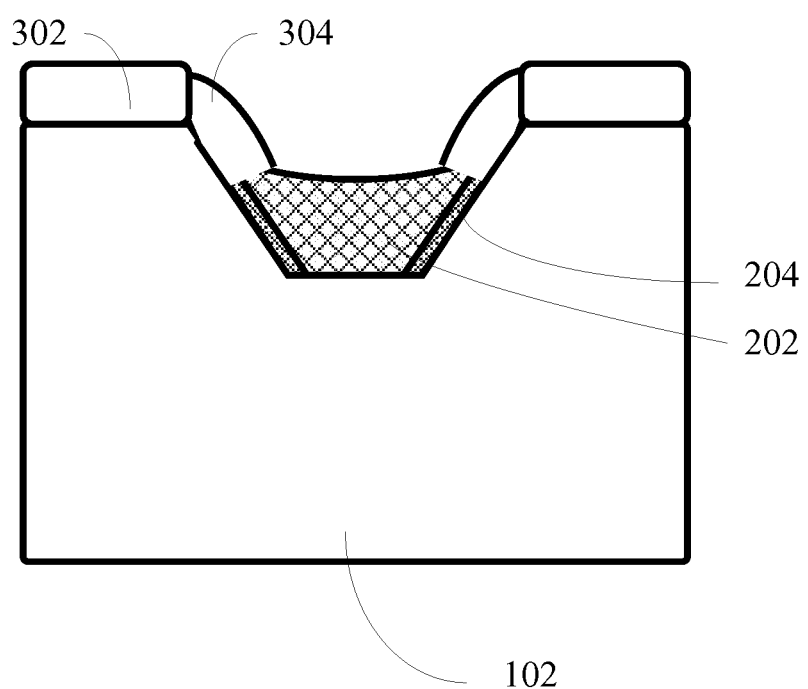

In order to allow the nitrogen-containing compound sidewall residue obtained in the subsequent steps to have the desired morphology, a special corner morphology is formed by oxidation after etching, i.e., a semi-spherical concave surface is formed on the surface of the silicon oxide in the trench. The silicon oxide in the trench gradually becomes thicker from the corner downward, thereby forming a rounded corner, as shown in FIG. 3. In FIG. 3, a first trench is formed on the surface of the silicon wafer, the first trench is filled with silicon oxide 202, and a silicon nitride layer 302 is formed around the top of the first trench. In this embodiment, the silicon oxide corner structure is obtained by low-temperature oxidation of 800° C. to 950° C. The low temperature oxidation is employed because the inventors have found that if a higher temperature (e.g., sacrificial oxidation of 1000° C.) is used, the dopant ions in the high concentration substrate of the wafer are easily reverse diffused into the low concentration epitaxial layer 102, which has a negative effect for the performance of the device.

In step S150, a nitrogen-containing compound is deposited on the surface of the wafer to cover the surface of the silicon oxide and a surface of the silicon oxide corner structure in the first trench.

In this embodiment, a thin layer of nitrogen-containing compound is formed by chemical vapor deposition, which is subsequently used as a hard mask for etching. The nitrogen-containing compound may be silicon nitride, silicon oxynitride, boron nitride, and titanium nitride, etc. In view of universality, silicon nitride commonly used in the art may be used.

In step S160, the nitrogen-containing compound is dry-etched, and a nitrogen-containing compound sidewall residue is formed on the surface of the silicon oxide corner structure extending into the first trench.

Referring to FIG. 3, the nitrogen-containing compound on the surface of silicon oxide 202 in the trench is removed exploiting the anisotropy of dry-etching, while the nitrogen-containing compound sidewall residue 304 extending into the trench is formed on the surface of the silicon oxide corner structure. The nitrogen-containing compound sidewall residue 304 and a portion of the silicon oxide 202 in the trench together serve as a sidewall structure of the trench.

In step S170, the silicon oxide and the wafer are continue-etched downwardly using the nitrogen-containing compound sidewall residue as a mask and a second trench is formed.

Figure 4:
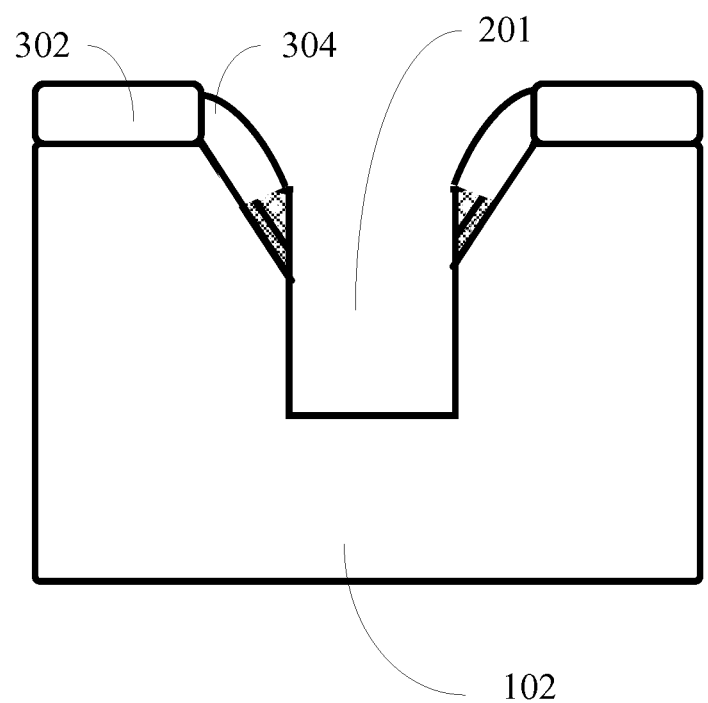

Referring to FIG. 4, the nitrogen-containing compound sidewall residue 304 covers only a portion of the first trench, such that areas not covered by the nitrogen-containing compound sidewall residue 304 will be etched downwardly (i.e., part of the silicon oxide 202, the sidewall oxide layer 204, and the epitaxial layer 102 are etched off) to form a second trench 201 (deep trench). The width of the second trench 201 is restricted by the nitrogen-containing compound sidewall residue 304, and apparently, the width of the second trench 201 is less than the width of the upper portion of the first trench, also the depth of the second trench 201 is greater than that of the first trench. Once using the nitrogen-containing compound sidewall residue 304 as a hard mask for the second trench etching, a lithographic plate may not be required and cost can be saved.

In an embodiment, the second trench 201 has a depth of 5 μm to 10 μm and can be deeper in other embodiments.

In step S180, a silicon oxide layer is formed on a sidewall and a bottom of the second trench.

Figure 5:
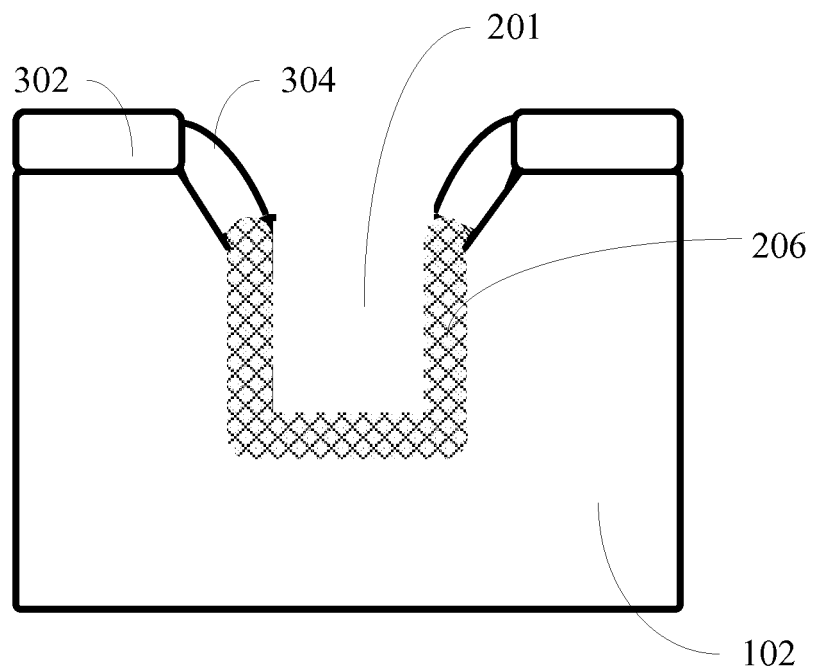

In this embodiment, since the silicon oxide layer 206 is formed by a thermal oxidation process, no silicon oxide layer 206 will be formed at a position covered by the nitrogen-containing compound sidewall residue 304, see FIG. 5.

In step S190, the nitrogen-containing compound sidewall residue is removed.

In order to remove the nitrogen-containing compounds completely, wet-etching may be employed, for example using concentrated phosphoric acid as the etchant. In this embodiment, the silicon nitride layer 302 and the nitrogen-containing compound sidewall residue 304 are removed together by concentrated phosphoric acid.

In step S200, the first trench and the second trench are filled with silicon oxide.

Figure 6:
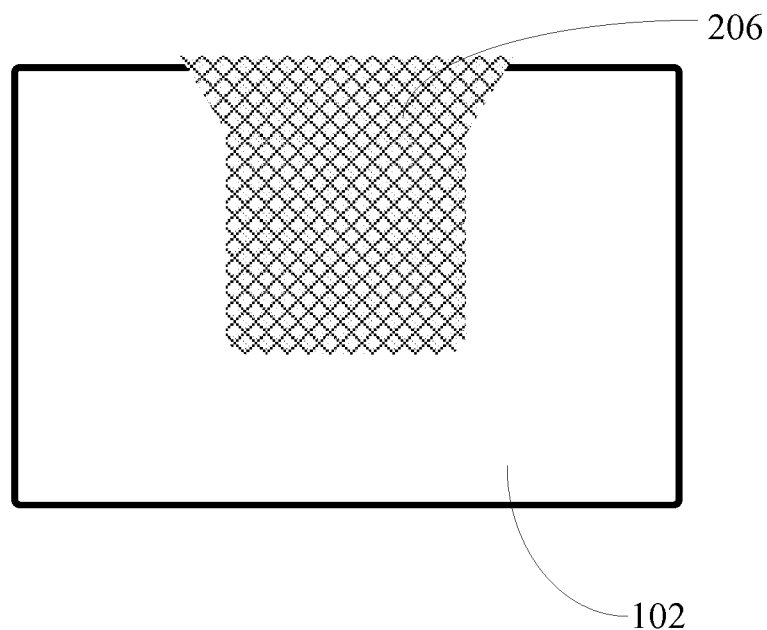

In this embodiment, the deposition of silicon oxide is performed using a high density plasma chemical vapor deposition (HDPCVD) process. After step S200 is completed, the silicon oxide exposed outside the first trench may be flattened by chemical mechanical polishing, see FIG. 6.

In the method of manufacturing an isolation structure of the LDMOS, a double-layer structure that the first trench plus the second trench is adopted, the presence of the upper shallow trench isolation structure can widen the depletion region at the bottom corner of the lower shallow trench isolation structure, so as to avoid the generation of a new dense electric field, and the electric field distribution between the source region and the drain region tends to be flat, thereby increasing the breakdown voltage. Since the nitrogen-containing compound sidewall residue is used as the hard mask for etching the second trench, the photolithography plate is saved.

The foregoing implementations are merely specific embodiments of the present disclosure, and are not intended to limit the protection scope of the present disclosure. It should be noted that any variation or replacement readily figured out by persons skilled in the art within the technical scope disclosed in the present disclosure shall all fall into the protection scope of the present disclosure. Therefore, the protection scope of the present disclosure shall be subject to the protection scope of the claims.

What is claimed is:

1. A method of manufacturing an isolation structure of LDMOS, comprising:
    forming a first trench having a wide top and a narrow bottom on a surface of the wafer;
    filling silicon oxide into the first trench by depositing;
    removing a portion of a surface of the silicon oxide in the first trench by etching;
    forming a silicon oxide corner structure at a corner of the top of the first trench by thermal oxidation, the silicon oxide corner structure being a structure in which the silicon oxide in the first trench gradually becomes thicker from the corner downward;
    depositing a nitrogen-containing compound on the surface of the wafer to cover the surface of the silicon oxide in the first trench and a surface of the silicon oxide corner structure;
    dry-etching the nitrogen-containing compound, removing the nitrogen-containing compound on the surface of the silicon oxide in the first trench, and forming a nitrogen-containing compound sidewall residue extending into the first trench on the surface of the silicon oxide corner structure;
    continuing etching the silicon oxide and the wafer downwardly using the nitrogen-containing compound sidewall residue as a mask and forming a second trench;
    forming a silicon oxide layer on a sidewall and a bottom of the second trench;
    removing the nitrogen-containing compound sidewall residue; and
    filling the first trench and the second trench with silicon oxide.

2. The method according to claim 1, wherein the first trench has a depth of 1 μm to 2 μm.

3. The method according to claim 1, wherein the step of forming the silicon oxide layer on the sidewall and the bottom of the second trench is performed by a thermal oxidation process, and the formed silicon oxide layer has a thickness of at least 1000 angstroms.

4. The method according to claim 1, wherein in the step of forming the first trench having the wide top and the narrow bottom on the surface of the wafer, an inclination angle of a slope of the formed first trench is 60 to 70 degrees.

5. The method according to claim 1, wherein prior to the step of filling silicon oxide into the first trench by depositing, the method further comprises a step of oxidizing a sidewall of the first trench.

6. The method according to claim 1, wherein prior to the step of forming the first trench having the wide top and the narrow bottom on the surface of the wafer, the method further comprises a step of forming a silicon nitride layer on the surface of the wafer, and the step of forming the first trench having the wide top and the narrow bottom on the surface of the wafer is to etch through the silicon nitride layer to form the first trench.

7. The method according to claim 6 wherein in the step of forming the first trench having the wide top and the narrow bottom on the surface of the wafer, and in the step of dry-etching the nitrogen-containing compound, $CHCl_3$ and/or $CH_2Cl_2$ are used as etchants.

8. The method according to claim 1, wherein in the step of forming the first trench having the wide top and the narrow bottom on the surface of the wafer, the first trench is formed by etching with fluorine-containing gas.

9. The method according to claim 1, wherein in the step of forming the silicon oxide corner structure at the corner of the top of the first trench by thermal oxidation, an oxidation temperature is from 800° C. to 950° C.

10. The method according to claim 1, wherein the nitrogen-containing compound is silicon nitride.

11. The method according to claim 1, further comprising a step of epitaxially growing an epitaxial layer on a substrate by an epitaxial process, the epitaxial layer having a higher doping concentration than that of the substrate, wherein the step of forming the first trench on the surface of the wafer is to form the first trench in the epitaxial layer.

12. The method according to claim 1, wherein in the step of filling the silicon oxide into the first trench by depositing, the deposition of silicon oxide is performed by using a high-density plasma chemical vapor deposition process.

13. The method according to claim 1, wherein after the step of filling the silicon oxide into the first trench by depositing, prior to the step of removing the portion of the surface of the silicon oxide in the first trench by etching, the method further comprises a step of removing the silicon oxide layer exposed outside the trench by chemical mechanical polishing.

14. The method according to claim 6, wherein after the step of filling the silicon oxide into the first trench by depositing, prior to the step of removing the portion of the surface of silicon oxide in the first trench by etching, the method further comprises a step of polishing the silicon oxide layer to the silicon nitride layer.

15. The method according to claim 1, wherein the step of removing the sidewall residue of the nitrogen-containing compound is performed by using concentrated phosphoric acid as an etchant.

16. The method according to claim 1, wherein in the step of filling the first trench and the second trench with the silicon oxide, the deposition of silicon oxide is performed using a high-density plasma chemical vapor deposition process.

17. The method according to claim 1, wherein the step of removing the portion of the surface of the silicon oxide in the first trench by etching is by dry-etching.

18. The method according to claim 17, wherein the step of removing the portion of the surface of the silicon oxide in the first trench by etching is performed using a high-density plasma etching process.

19. The method according to claim 1, wherein in the step of continuing etching the silicon oxide and the wafer downwardly and forming the second trench, the formed second trench has a depth of 5 μm to 10 μm.

20. The method according to claim 1, wherein after the step of filling the first trench and the second trench with the silicon oxide, the method further comprises a step of flattening the silicon oxide exposed outside the first trench by chemical mechanical polishing.

\* \* \* \* \*